United States Patent [19]

Geissler

[11] Patent Number: 5,753,951
[45] Date of Patent: May 19, 1998

[54] EEPROM CELL WITH CHANNEL HOT ELECTRON PROGRAMMING AND METHOD FOR FORMING THE SAME

[75] Inventor: Stephen Frank Geissler, Underhill, Vt.

[73] Assignee: International Business Machines Corporation, Armonk, N.Y.

[21] Appl. No.: 507,684

[22] Filed: Jul. 25, 1995

[51] Int. Cl.[6] .................................................. H01L 29/788
[52] U.S. Cl. .......................... 257/316; 257/321; 257/622; 257/655
[58] Field of Search ................................. 257/316, 321, 257/622, 655

[56] References Cited

U.S. PATENT DOCUMENTS

| | | | |
|---|---|---|---|
| 4,425,631 | 1/1984 | Adam | 365/185 |
| 4,511,811 | 4/1985 | Gupta | 307/463 |
| 4,673,829 | 6/1987 | Gupta | 307/296 A |
| 4,796,228 | 1/1989 | Baglee | 365/185 |
| 4,814,840 | 3/1989 | Kameda | 357/23.5 |
| 4,835,741 | 5/1989 | Baglee | 365/185 |
| 4,975,383 | 12/1990 | Baglee | 437/43 |
| 4,975,384 | 12/1990 | Baglee | 437/43 |
| 4,990,979 | 2/1991 | Otto | 357/23.5 |
| 5,040,036 | 8/1991 | Hazani | 357/23.5 |
| 5,053,839 | 10/1991 | Esquivel et al. | 365/185.16 |
| 5,162,247 | 11/1992 | Hazani | 437/43 |
| 5,291,439 | 3/1994 | Kauffmann et al. | 365/185 |
| 5,315,142 | 5/1994 | Acovic et al. | 257/321 |
| 5,486,714 | 1/1996 | Hong | 257/321 |
| 5,519,653 | 5/1996 | Thomas | 257/317 |

OTHER PUBLICATIONS

Hsu, C.H. & Wu, B.S., "EEPROM Cell For Low Power And High Density Application," IBM Technical Disclosure Bulletin, vol. 35, No. 4B, Sep. 1992, pp. 23–25.

Primary Examiner—Mark V. Prenty
Attorney, Agent, or Firm—Heslin & Rothenberg, P.C.

[57] ABSTRACT

An EEPROM memory cell has a floating gate structure that extends over a sharp edge of a memory cell trench and into the trench. Channel hot electron injection techniques are used in conjunction with the floating gate structure to lower required programming voltages and times for the EEPROM cell. Further reductions in programming times and voltages are achieved using trench sidewall diffusions and substrate surface grooves. When used, the floating gate contourally follows the grooves intersecting the surface of the substrate.

13 Claims, 6 Drawing Sheets fig. 1 fig. 2 fig. 3 fig. 4 fig. 5 fig. 6 fig. 7 fig. 8 fig. 9 fig. 10 fig. 11 fig. 12

EEPROM CELL WITH CHANNEL HOT ELECTRON PROGRAMMING AND METHOD FOR FORMING THE SAME

TECHNICAL FIELD

The present invention relates in general to semiconductor memory devices suitable for electrically erasable programmable read only memories (EEPROMs), and more particularly, is directed to a floating gate memory cell structure that enhances writing to the memory cell through channel hot electron injection.

BACKGROUND OF THE INVENTION

Non-volatile floating gate Metal Oxide Semiconductor ("MOS") memories are well known in the industry. In such devices, the conductive state of the transistor memory cell is determined by the voltage of the associated floating gate. Typically, a negatively charged floating gate represents a binary one state while an uncharged floating gate represents a binary zero state.

More particularly, a conventional Electrically Erasable Programmable Read Only Memory ("EEPROM") utilizes a floating (unconnected) conductive gate, in a field effect transistor structure, positioned over but insulated from a channel region in a semiconductor substrate, between source and drain regions. A control gate is then provided over the floating gate, but also insulated therefrom. The threshold voltage ($V_T$) characteristic of the transistor is controlled by the amount of charge retained on the floating gate. That is, the minimum amount of voltage (i.e., threshold) that must be applied to the control gate before the transistor is turned "on" to permit conduction between its source and drain regions is controlled by the level of charge on the floating gate. A transistor is conventionally programmed to one of two states by directly accelerating electrons from the substrate channel region, through a thin gate dielectric and onto the floating gate.

The memory cell transistor's state is read by placing an operating voltage across its source and drain and on its control gate, and then detecting the level of current flowing between the source and drain as to whether the device is programmed to be "on" or "off" at the control gate voltage selected. A specific, single cell in a two dimensional array of EEPROM cells is addressed for reading by application of a source-drain voltage to the source and drain lines in a column containing the cell being addressed, and application of a control gate voltage to the control gates in a row containing the cell being addressed.

Conventionally, to write data into a memory cell, the cell must be first erased and then written. Each of these operations takes approximately ten milliseconds, and each requires, for example, a 20 V supply of voltage. Decoder circuits are used to sustain the needed high voltages at the appropriate cells. These high voltage circuits generally do not scale down in size with the decreasing line widths now attainable with ever improving lithographic techniques. (By comparison, to read a device typically requires three to five volts applied and read cycle times are on the order of hundreds of nanoseconds.) The present invention is directed toward reducing the conventionally required time and voltage for writing to an EEPROM memory cell.

DISCLOSURE OF THE INVENTION

In a first aspect, the present invention includes a memory cell comprising a substrate having a main surface and a trench intersecting the main surface of the substrate at a sharp edge. The trench has a sidewall. Included in the memory cell is a floating gate having a first portion extending parallel to and above the main surface of the substrate and a second portion extending over the sharp edge, into the trench and parallel to the sidewall thereof. A control gate is disposed above, and electrically insulated from, the floating gate. The memory cell also includes a means for biasing the substrate and the control gate to impose charge on the floating gate thereby writing to the memory cell using channel hot electrons. When biased, a vertical electric field used to impose charge on the floating gate is strengthened by the sharp edge.

As an enhancement, the substrate of the memory cell may include at least one groove intersecting its main surface, wherein the first portion of the floating gate conforms to a contour of the at least one groove. Two groove sharp edges are defined at the intersection of each of the at least one groove and the substrate. Strengthening of the vertical electric field used to impose charge on the floating gate is provided by the groove sharp edges. Further, the at least one groove may be both shallower and/or narrower than the trench.

As a further enhancement, the trench may comprise a first trench and the sharp edge may comprise a first sharp edge. The substrate may then further include a second trench intersecting the main surface thereof and having a sidewall. A second sharp edge is defined at an intersection of the second trench and the substrate. Moreover, the floating gate includes a third portion extending into the second trench and disposed parallel to the sidewall of said second trench whereby the second sharp edge further strengthens the vertical electric field used to impose charge on said floating gate. Furthermore, the at least one groove may be disposed between and parallel to the first trench and the second trench.

As yet another enhancement, the memory cell may include a diffusion region in the substrate adjacent to the sidewall of the trench. When the memory cell is biased, writing thereto using channel hot electron injection is enhanced by a lateral electric field strength increased as a result of the diffusion region. If the memory cell has two trenches, the sidewall of each trench may have a diffusion region adjacent to it in the substrate to further increase the lateral electric field strength and enhance the writing to the memory cell using channel hot electron injection.

As further enhancements, the diffusion region may have a doping concentration greater than that of the substrate. For example, the doping concentration of the diffusion region may be 10–100 times greater than that of the substrate. Further, a bottom of the trench may be defined by an upper surface of an insulating layer, and the diffusion may extend within the substrate below a level defined by the bottom of the trench. The diffusion region may extend to the main surface of the substrate.

Another aspect of the present invention includes a method for use in forming a portion of a memory cell. The method includes providing a substrate having a main surface and forming a trench in the substrate and intersecting the main surface of the substrate such that the trench has a sidewall. A sharp edge is defined at the intersection of the substrate and the trench. The sharp edge strengthens a vertical electric field used in writing to the memory cell using channel hot electron injection.

At least one groove is formed in the substrate and intersects the main surface thereof. Two groove sharp edges are defined at the intersection of each groove and the substrate. The groove sharp edges further enhance the vertical electric field used to write to the memory cell.

Also formed is a floating gate having a first portion disposed above and contourally following the main surface of the substrate including following a contour defined by the at least one groove. The floating gate also has a second portion disposed within the trench and parallel to the sidewall thereof such that the floating gate passes over the sharp edge. Writing to the memory cell comprises using channel hot electron injection to transfer charge into the floating gate using the strengthened vertical electric field.

In yet another aspect, the present invention includes a method for use in forming a portion of a memory cell. The method includes providing a substrate having a main surface and forming a trench in the substrate and intersecting the main surface of the substrate such that the trench has a sidewall. A sharp edge is defined at the intersection of the substrate and the trench. The sharp edge strengthens a vertical electric field used in writing to the memory cell using channel hot electron injection.

A diffusion region is implanted in a portion of the substrate adjacent to the sidewall of the trench. The diffusion region strengthens a lateral electric field used in writing to the memory cell using channel hot electron injection.

Also formed is a floating gate having a first portion disposed above and parallel to the main surface of the substrate. The floating gate also has a second portion disposed within the trench and parallel to the sidewall thereof having the diffusion region adjacent thereto such that the floating gate passes over the sharp edge. Writing to the memory cell comprises using channel hot electron injection to transfer charge into the floating gate using the lateral electric field and the vertical electric field.

The present invention has many advantages and features associated with it. The extension of the floating gate over the sharp corners of the trenches and into the trenches, in combination with channel hot electron programming techniques reduce the voltage and time necessary for writing to the memory cell disclosed herein. Programming voltages and times are further reduced through the use of trench sidewall diffusions and substrate surface grooves. By reducing the required programming voltages, the decode circuits on the memory chip that includes the memory cell of the present invention are simplified. Such simplification enables a reduction in size of the decode circuits which permits higher density IC chips. Thus, by facilitating a reduction in programming voltages and times, and enabling further increases in circuit density, the field of EEPROM memories is advanced by the techniques disclosed herein.

BRIEF DESCRIPTION OF THE DRAWINGS

The subject matter regarded as the present invention is particularly pointed out and distinctly claimed in the concluding portion of the specification. The invention, however, both as to organization and method of practice, together with further objects and advantages thereof, may best be understood by reference to the following detailed description taken in conjunction with the accompanying drawings in which:

BEST MODE FOR CARRYING OUT THE INVENTION

The techniques of the present invention facilitate the formation of an Electrically Erasable Programmable Read Only Memory ("EEPROM") cell that requires lower voltages and shorter times to program than were heretofore required. The EEPROM cell is written to using channel hot electron injection such that requisite voltages are lower and programming times are shorter than those voltages and times that correspond to previously used direct tunnelling techniques.

Figure 5:
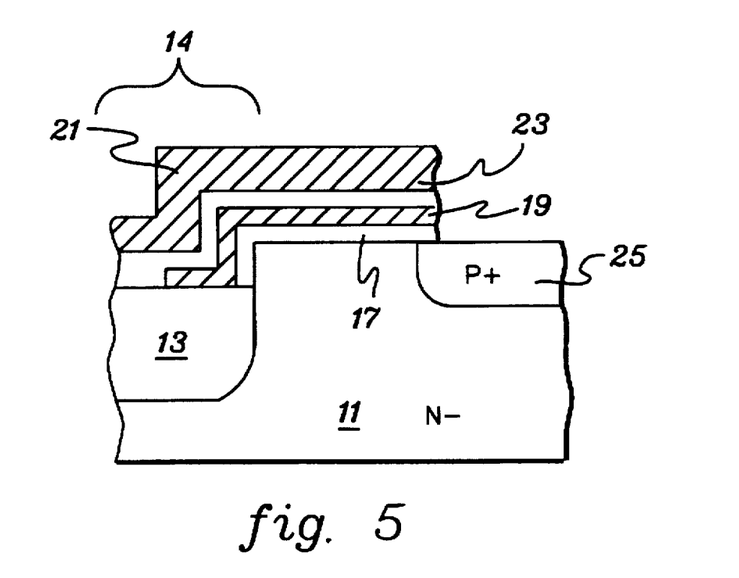
FIGS. 5–7 are cross-sectional views of the EEPROM cell of FIG. 4 pursuant to one embodiment of the present invention.
Figure 6:
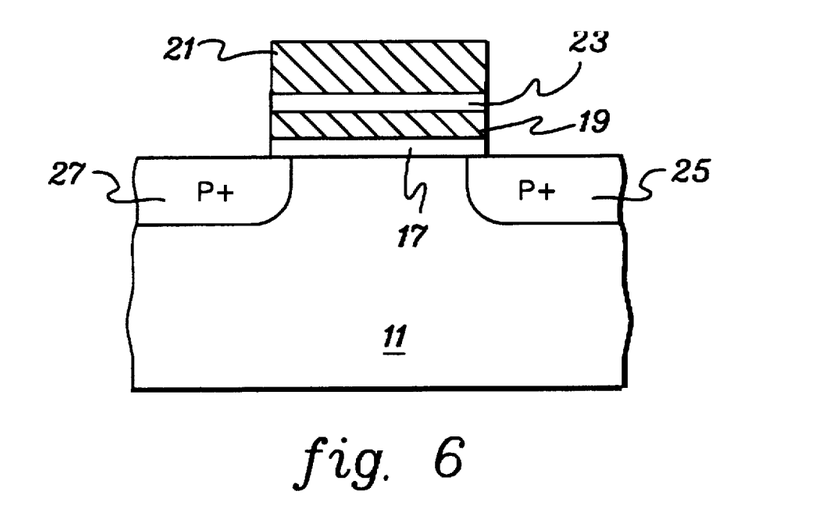

Shown in FIGS. 4–7 is an EEPROM cell formed according to the techniques of the present invention. A silicon substrate 11 has trenches 14 formed therein and partially filed with oxide 13. Passing over these trenches is a control gate 21, while a floating gate 19 terminates in each cell after extending into trench 14 and extending to the bottom thereof (FIG. 5). Substrate 11 may comprise, for example, a N-type substrate and the EEPROM cell includes P+ diffusions 25 and 27 (FIG. 6) to form a P-channel device for memory cell storage. An insulating layer 17 separates floating gate 19 from substrate 11, and an insulating layer 23 separates control gate 21 from floating gate 19.

Figure 7:
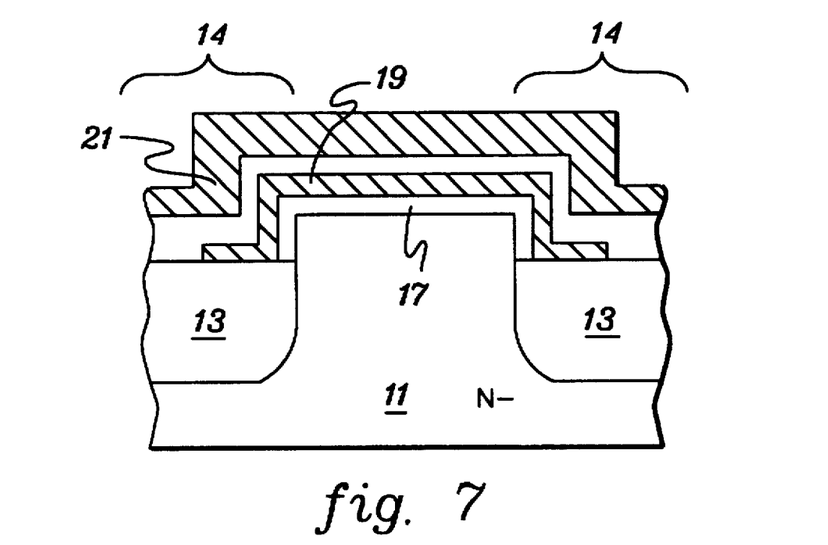

As best shown in FIGS. 5 and 7, floating gate 19 passes over the sharp edge of trench 14 and down into the trench along its side-wall. The sharp bend in floating gate 19 as it dips down into the trench results in very high field strengths being generated at the sharp bend, enhancing the channel hot electron effect and thereby lowering the programming voltages and time necessary to write data to the EEPROM cell as will be discussed in further detail hereinbelow.

The conventional functions of the individual elements of the EEPROM cell of FIGS. 4–7 will be apparent to one of ordinary skill in the art. As examples, descriptions of other EEPROM cells may be found in "NON-VOLATILE MEMORY CELL," Otto, U.S. Pat. No. 4,990,979 and in "ERASABLE ELECTRICALLY PROGRAMMABLE READ ONLY MEMORY CELL USING TRENCH EDGE TUNNELLING," Baglee, U.S. Pat. No. 4,975,384 both of which are expressly incorporated by reference herein in their entirety.

In the present invention, the voltage level requirements for writing the EEPROM memory cell are reduced as compared to the voltages required for direct tunneling techniques. By appropriately biasing the EEPROM cell, channel hot electron injection may be used to write to the memory cell at reduced voltages. As an example, reference is made to the following table which contains example voltages. These voltages will vary based upon individual fabrication geometries:

TABLE 1

|         | Control Gate | Drain  | Source |
|---------|--------------|--------|--------|
| Erase   | -6v          | 0v     | 0v     |
| Program | -1.25v       | -6v    | 0v     |
| Read    | -3.3v        | -3.3v  | 0v     |

Channel hot electron injection occurs as a result of a source to drain potential (e.g., 6 volts) being applied in connection with a gate to source potential (e.g., 1.25 volts). When these voltages are applied, channel carriers (i.e., holes for a P-channel MOS device) moving from the source to the drain are "heated" by the electric field created by the source to drain voltage potential. The holes accelerate to a sufficient energy for impact ionization to occur, upon which a plasma of energetic hole-electron pairs is formed at the surface of the silicon substrate containing the source/drain diffusions (e.g., the surface of substrate 11 underneath floating gate 19). A small fraction of the created electrons will have enough energy to surmount the oxide energy barrier (insulator 17) and be trapped in floating gate 19. The gate to source voltage potential enhances the penetration of insulator 17 by hot electrons, however, the gate to source potential is, for example, an order of magnitude less than that required for prior direct electron injection techniques.

The emission probability of an electron penetrating insulator 17 is dependent on lateral electric fields and vertical electric fields. The lateral electric fields are between the source and drain and are strongly dependent on the source to drain voltage potential and on doping concentrations in the channel region, where higher doping concentrations increase the lateral electric fields. The vertical electric fields are between the gate and substrate and are dependent on the gate to source voltage potential and on the gate oxide (insulator 17) thickness, wherein the vertical fields are increased by reducing the gate oxide thickness.

Passing the floating gate over the sharp trench edges enhances the channel hot electron effect thereby reducing programming voltages and times. To explain, channel hot electron injection is strongly dependent on the strength of the vertical electric filed in the gate oxide (insulator 17). The vertical electric field is higher at the trench edge than in the substrate 11 surface region between the trenches. The sharpness of the trench edge intensifies the vertical electrical field. Accordingly, the intensified electrical field assists in the electrons penetration of insulator 17 and movement into floating gate 19. Thus, lower voltage potentials and shorter programming times may be used to create a sufficient electrical field for cell programming.

To support the reduced programming voltage requirement of the EEPROM cell of the present invention, the decoder/driver circuitry conventionally disposed on the EEPROM IC chip must be redesigned. The voltages generated are reduced to be commensurate with, for example, the voltages in Table 1 above. The individual details of redesigning the decoder/driver will be apparent to one of ordinary skill in the art. In fact, the reduced voltage requirements simplify the circuit design and advantageously facilitate a reduction in decoder/driver circuit sizing. As examples of decoder/driver circuits for an EEPROM cell, reference is made to "CHARGE PUMP FOR PROVIDING PROGRAMMING VOLTAGE TO THE WORD LINES IN A SEMICONDUCTOR MEMORY ARRAY," Gupta, U.S. Pat. No. 4,673,829, issued Jun. 6, 1987 and "CHARGE PUMP FOR PROVIDING PROGRAMMING VOLTAGE TO THE WORD LINES IN A SEMICONDUCTOR MEMORY ARRAY," Gupta, U.S. Pat. No. 4,511,811, issued Apr. 16, 1985, both of which are hereby expressly incorporated by reference herein in their entirety.

Figure 1:
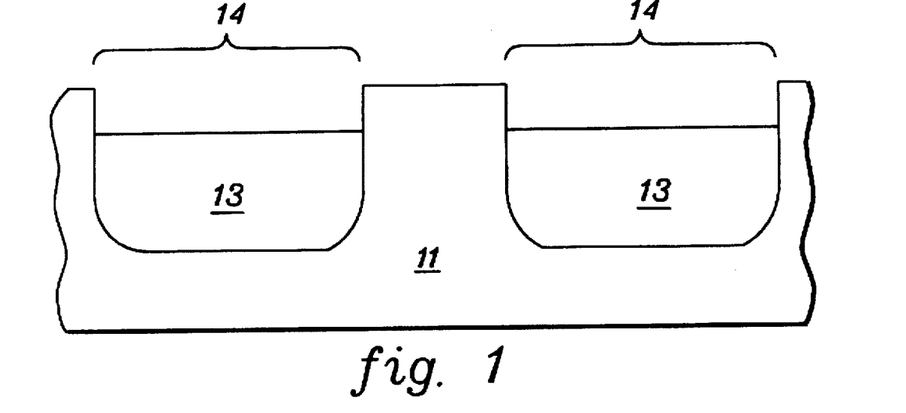
FIG. 1 is a cross-sectional view of an EEPROM cell during an early stage in its fabrication from a wafer pursuant to one embodiment of the present invention.
Figure 2:
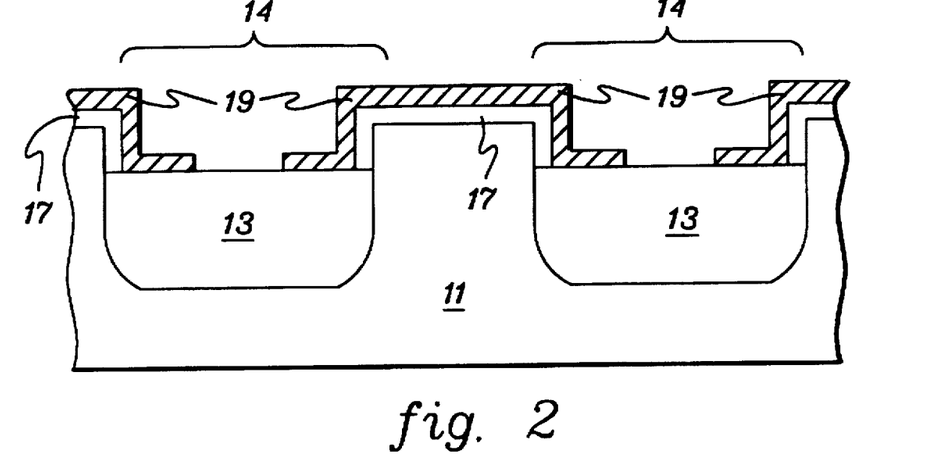
FIG. 2 is a cross-sectional view of the EEPROM cell of FIG. 1 following formation of a floating gate according to an embodiment of the present invention.

The individual steps of one processing sequence for fabricating the EEPROM device of FIGS. 4–7 are discussed below with reference to the fabrication sequence of FIGS. 1–3. An N-type substrate 11 is provided and trenches 14 are formed therein by mask/directional etch processes (FIG. 1). For example, openings for trenches 14 may be photolithographically defined followed by a directional dry etch comprising a Reactive Ion Etching ("RIE") process.

The trenches are then filled with oxide 13 by, for example, a CVD process. As the CVD process will blanket the entire wafer with oxide, the wafer is planarized to remove oxide from all areas but the trenches. Planarization may be performed by, for example, Chemical Mechanical Polishing ("CMP"). The oxide is then recessed, for example, 500–1000 Å. As a process example, a selective etch may be used to recess the oxide.

In a following process step, floating gate insulating layer 17 is grown using, for example, a thermal oxidation process. After that, the floating gate is deposited and defined. As a specific process example, a blanket CVD of polysilicon followed by a mask/etch process may be used to form and define floating gates 19. Definition of floating gates 19 may be performed using a conventional mask/etch process.

Figure 3:
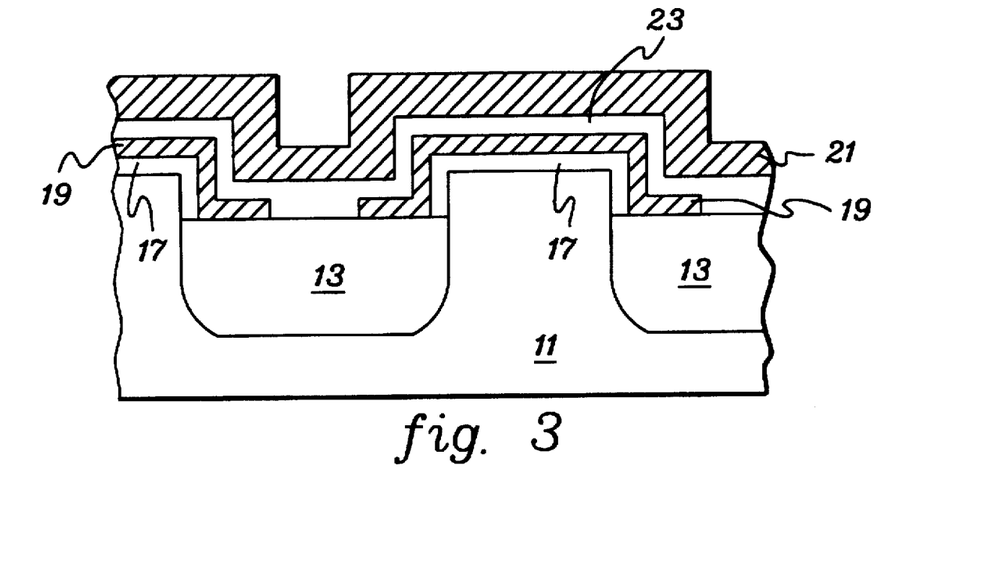
FIG. 3 is a cross-sectional view of the EEPROM cell of FIG. 2 after the formation of a control gate in conformance with one embodiment of the present invention.
Figure 4:
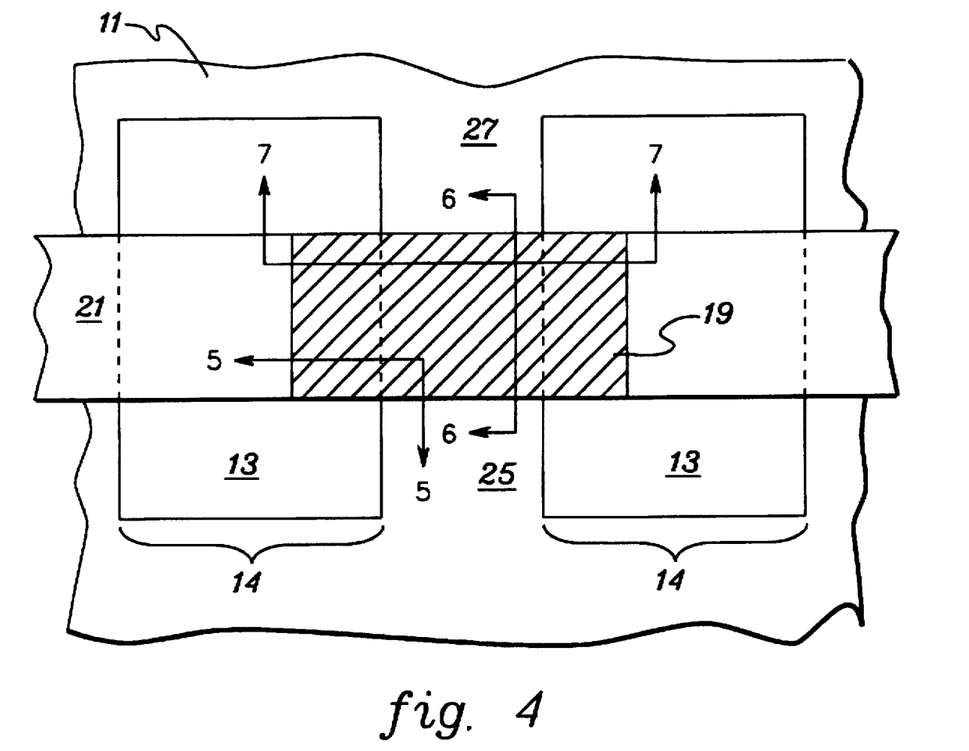
FIG. 4 is a top view of the EEPROM cell of FIG. 3 in accordance with an embodiment of the present invention.

To continue, control gate oxide 23 is grown over the previously formed structures using, for example, a blanket CVD process (FIG. 3). Thereafter, control gate 21 is deposited using a CVD of polysilicon. The control gate is defined with, for instance, a mask/etch process. After that, source 27 and drain 25 (FIG. 6) regions are implanted as P+ regions using, for example, a Boron implant. The formation of wiring to source 27, drain 25 and control gate 21 and the formation of final insulation and wiring levels for EEPROM cells are conventional and are not discussed further herein.

In accordance with the above process, an EEPROM cell is formed that is programmable using a lower voltage than was heretofore possible. The combination of the trench bounded EEPROM cell structure described and shown herein in combination with channel hot electron injection programming techniques have a synergistic relationship that contributes to reduced programming voltages and times. Further reduction in programming voltages and times are achievable in alternate embodiments of the present invention.

Figure 8:
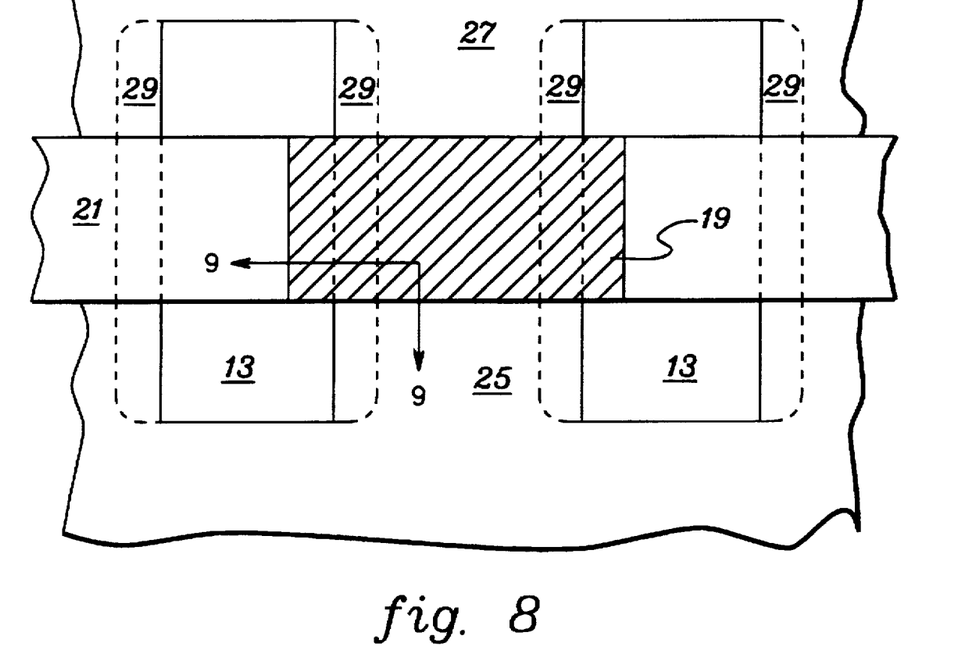
FIGS. 8–9 are a top view and a cross-sectional view, respectively, of an EEPROM cell incorporating trench sidewall diffusions according to an embodiment of the present invention.
Figure 9:
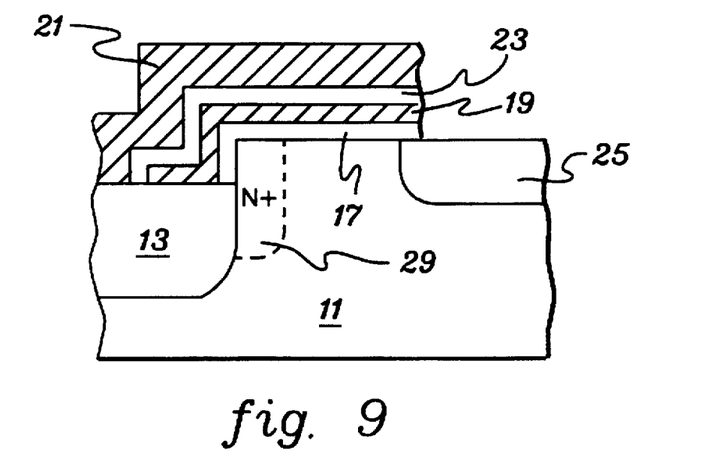

In a first alternate embodiment of the present invention, the substrate regions adjacent to the sidewalls of the trenches 14 include a diffusion region. As one example, FIGS. 8 and 9 show an embodiment of the present invention in which the substrate adjacent to the sidewalls of the trenches have N+ diffusion regions 29 therein. The substrate sidewall diffusion is of the same type as N-type substrate 11. Diffusions 25 and 27 are of the P+ type to facilitate operation of the cell transistor.

The sidewall diffusion enhances the channel hot electron effect used to program the EEPROM cell of the present invention. As discussed above, a high doping concentration is placed at the trench edge (i.e., in the substrate adjacent to the sidewall). The high doping concentration reduces the depletion region length between the drain and the substrate thereby increasing the lateral electric field strength. The resulting higher lateral electrical field in combination with the higher vertical field resulting from the sharp trench edges discussed hereinabove results in an increased flow of electrons into the floating gate. Thus, the voltages and times required for charging the floating gate to program the EEPROM cell may be reduced.

The process for fabricating the cell with sidewall diffusion 29 proceeds similarly to the process discussed above for the cell of FIGS. 4–7. One difference includes the implantation of sidewall diffusion 29. This may be performed after the definition and etching of the trenches and before their filling with oxide 13. An example process that may be used to implant the sidewall diffusion is an angled ion implantation process. The individual steps for performing such an implantation will be apparent to one of ordinary skill in the art. The doping concentration of the implantation may be, for example, greater than the doping concentration of the substrate itself, and in another example, 10 to 100 times the doping concentration of the substrate itself. Depositing insulator 13 after implantation of diffusion 29 results in a diffusion region extending in the substrate adjacent to the trench sidewall from the main surface of the substrate to below a level defined by an upper surface of insulator 13 (i.e., the bottom of the trench). The remainder of the EEPROM cell fabrication process remains the same as discussed above in regard to FIGS. 1–7.

Figure 10:
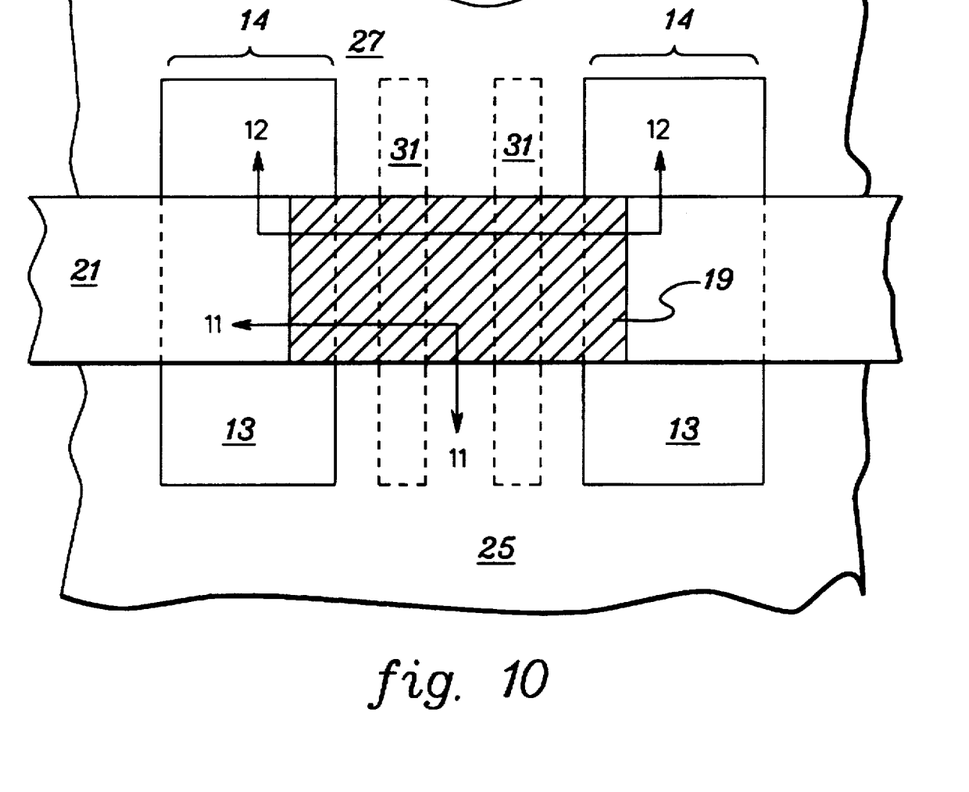
FIGS. 10–12 are a top view and cross-sectional views, respectively, of an EEPROM cell incorporating substrate surface grooves in conformance with an embodiment of the present invention.
Figure 11:
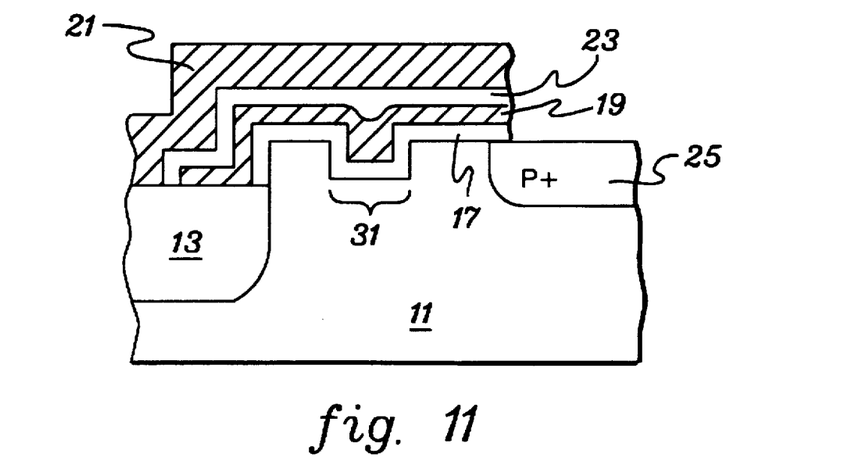
Figure 12:
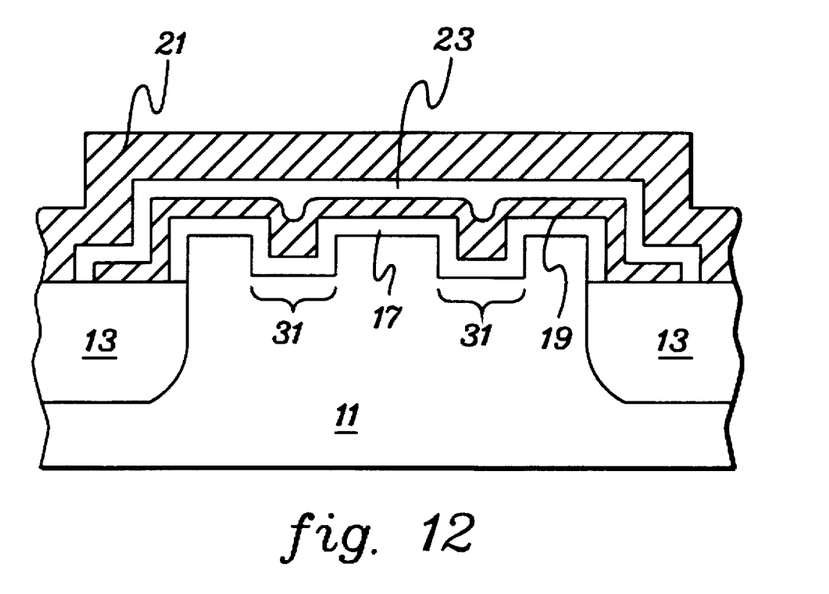

In a second alternate embodiment of the present invention, grooves 31 are formed intersecting the surface of the substrate between trenches 14 (FIGS. 10–12). Floating gate 19 contourally follows the grooved substrate surface terminating in a trench 14 at each of its ends. Both insulating layer 17 and floating gate 19 contourally follow the surface profile of substrate 11 having grooves 31 therein.

It has been discussed herein how the vertical electrical field strength is increased at the sharp trench edges, thereby facilitating reduced programming voltages and times. Grooves 31 provide more sharp edges, providing more areas having an enhanced electrical field. Therefore, even further reductions in programming times and voltages can be achieved through the use of substrate surface grooves between the trenches of an EEPROM cell.

As used herein, the term "groove" is defined to means a structure similar to a trench in shape, but dimensionally smaller. As an example, trenches 14 of FIGS. 10–12 may be 4000–5000 Å deep, while grooves 31 may be 500–1000 Å deep. As shown, grooves 31 are substantially parallel to each other and disposed between trenches 14 that bound the shown EEPROM cell. Although two grooves 31 are shown, any number of grooves are possible that will fit in the cell area between the trenches.

The process for fabricating the EEPROM cell with grooves 31 proceeds similarly to the process discussed above for the cell of FIGS. 1–7. One difference includes the formation of grooves 31. These may be formed either before or after the definition and etching of the trenches, but before their filling with oxide 13. Oxide 13 will fill the grooves when the trenches are filled, however, this oxide 13 is removed by the etch process used to recess oxide 13 in trenches 14. An example process that may be used to form the grooves is a conventional mask and etch process similar to that used to form the trenches. The individual steps for performing such an implantation will be apparent to one of ordinary skill in the art. The remainder of the EEPROM cell fabrication process remains the same as discussed above in regard to FIGS. 1–7.

The techniques discussed herein may be used in combination to further reduce EEPROM cell programming voltages and times. For example, grooves 31 of FIGS. 10–12 may be combined with sidewall diffusion 29 of FIGS. 8–9.

To summarize, the present invention has many advantages and features associated with it. The extension of the floating gate over the sharp corners of the trenches and into the trenches, in combination with channel hot electron programming techniques reduce the voltage and time necessary for writing to the memory cell disclosed herein. Programming voltages and times are further reduced through the use of trench sidewall diffusion and substrate surface grooves. By reducing the required programming voltages, the decode circuits on the memory chip that includes the memory cell of the present invention are simplified. Such simplification enables a reduction in size of the decode circuits which permits higher density IC chips. Thus, by facilitating a reduction in programming voltages and times, and enabling further increases in circuit density, the field of EEPROM memories is advanced by the techniques disclosed herein.

While the invention has been described in detail herein in accordance with certain preferred embodiments thereof, many modifications and changes therein may be affected by those skilled in the art. Accordingly, it is intended by the appended claims to cover all such modifications and changes as fall within the true spirit and scope of the invention.

I claim:

1. A memory cell comprising:

a substrate having a main surface and a trench intersecting said main surface, said trench having a sidewall and said substrate having a sharp edge at an intersection of said substrate and said trench;

an elongate floating gate having a first portion extending parallel to and above said main surface of said substrate and having a second portion connected to said first portion at a right angle so as to extend over said sharp edge, into said trench and parallel to said sidewall thereof, wherein said sharp edge is oriented substantially transverse to said elongate floating rate and said sharp edge defines a region of higher electron injection efficiency at said right angle connection of said first portion and said second portion of said elongate floating gate;

a control gate disposed above, and electrically insulated from, said floating gate;

a source and a drain, said source and drain being disposed on opposite sides of said elongate floating gate;

means for biasing said substrate and said control gate to impose charge on said floating gate thereby writing to the memory cell using channel hot electrons, whereby when biased, a vertical electric field used to impose charge on said floating gate is strengthened by said sharp edge, thereby producing said region of higher electron injection efficiency; and wherein said substrate includes at least one groove intersecting said main surface of said substrate and oriented substantially transverse said elongate floating gate, at least two groove sharp edges being defined at the intersection of each groove of said at least one groove and said substrate, and wherein said first portion of said elongate floating gate conforms to a contour of said at least one groove such that each groove sharp edge defines a right angle bend in said first portion of said elongate floating gate and further strengthens the vertical electric field used to impose charge on said floating gate, thereby defining a supplemental region of higher electron injection efficiency.

2. A memory cell comprising:

a substrate having a main surface and a trench intersecting said main surface, said trench having a sidewall and said substrate having a sharp edge at an intersection of said substrate and said trench;

an elongate floating gate having a first portion extending parallel to and above said main surface of said substrate and having a second portion connected to said first portion at a right angle so as to extend over said share edge, into said trench and parallel to said sidewall thereof, wherein said sharp edge is oriented substantially transverse to said elongate floating gate and said sharp edge defines a region of higher electron injection efficiency at said right angle connection of said first portion and said second portion of said elongate floating gate;

a control gate disposed above, and electrically insulated from, said floating gate;

a source and a drain, said source and drain being disposed on opposite sides of said elongate floating gate;

means for biasing sail substrate and said control gate to impose charge on said floating gate thereby writing to the memory cell using channel hot electrons, whereby when biased, a vertical electric field used to impose charge on said floating gate is strengthened by said sharp edge, thereby producing said region of higher electron injection efficiency; and wherein said substrate includes a plurality of grooves intersecting said main surface of said substrate, each oriented substantially transverse said elongate floating gate, and at least two groove sharp edges being defined at the intersection of each groove of said plurality of grooves and said substrate, and wherein said first portion of said elongate floating gate conforms to a contour of said plurality of grooves such that each groove sharp edge defines a right angle bend in said first portion of said elongate floating gate and further strengthens the vertical field used to impose charge on said floating gate, thereby defining a supplemental region of higher electron injection efficiency.

3. The memory cell of claim 1, wherein said trench comprises a first trench and said sharp edge comprises a first sharp edge, said substrate further including a second trench intersecting the main surface thereof and having a sidewall, said substrate having a second sharp edge at an intersection of said second trench and said substrate, and wherein said second sharp edge is oriented substantially transverse said elongate floating gate and said elongate floating gate further includes a third portion connected to said first portion at a right angle so as to extend into said second trench and be disposed parallel to said sidewall of said second trench whereby said second sharp edge further strengthens the vertical electric field used to impose charge on said floating gate creating a further region of higher electron injection efficiency at said right angle connection of said first portion and said third portion of said floating gate.

4. The memory cell of claim 3, wherein said at least one groove is disposed between said first trench and said second trench.

5. The memory cell of claim 4, wherein each of said first trench, said second trench, and said at least one groove are substantially parallel to each other.

6. The memory cell of claim 1, wherein said at least one groove has a depth less than a depth of said trench.

7. A memory cell comprising:

a substrate having a main surface and a trench intersecting said main surface, said trench having a sidewall and said substrate having a sharp edge at an intersection of said substrate and said trench;

a floating gate having a first portion extending parallel to and above said main surface of said substrate and having a second portion extending over said sharp edge, into said trench and parallel to said sidewall thereof;

a control gate disposed above and electrically insulated from, said floating gate;

means for biasing said substrate and said control gate to impose charge on said floating gate thereby writing to the memory cell using channel hot electrons, whereby when biased, a vertical electric field used to impose charge on said floating gate is strengthened by said sharp edge;

wherein said substrate includes at least one groove intersecting said main surface of said substrate, at least two groove sharp edges being defined at the intersection of each groove of said at least one groove and said substrate, and wherein said first portion of said floating gate conforms to a contour of said at least one groove, such that each groove sharp edge further strengthens the vertical electric field used to impose charge on said floating gate; and wherein said at least one groove has a width less than a width of said trench.

8. A memory cell comprising:

a substrate having a main surface and a trench intersecting said main surface, said trench having a sidewall and said substrate having a sharp edge at an intersection of said substrate and said trench;

a floating gate having a first portion extending parallel to and above said main surface of said substrate and having a second portion extending over said sharp edge, into said trench and parallel to said sidewall thereof;

a control gate disposed above, and electrically insulated from, said floating gate;

means for biasing said substrate and said control gate to impose charge on said floating gate thereby writing to the memory cell using channel hot electrons, whereby when biased, a vertical electric field used to impose charge on said floating gate is strengthened by said sharp edge; and further including a diffusion region in said substrate adjacent to said sidewall of said trench such that when said memory cell is biased for writing thereto using channel hot electrons, a lateral electric field strength is increased by said diffusion region thereby further facilitating writing to said memory cell using channel hot electron injection.

9. The memory cell of claim 8, wherein said trench comprises a first trench and said sharp edge comprises a first sharp edge, said substrate further including a second trench intersecting the main surface thereof and having a sidewall, said substrate having a second sharp edge at an intersection of said second trench and said substrate and having a diffusion region adjacent to said sidewall of said second trench, and wherein said floating gate further includes a third portion extending into said second trench and disposed parallel to said sidewall of said second trench whereby said second sharp edge further strengthens the vertical electric field and said diffusion region of said second trench further strengthens the lateral electric field strength used to impose charge on said floating gate and write to said memory cell using channel hot electrons.

10. The memory cell of claim 8, wherein said substrate has a first dopant concentration and said diffusion region has a second dopant concentration, said second dopant concentration being greater than said first dopant concentration such that said lateral electric field strength is further increased.

11. The memory cell of claim 10, wherein said second dopant concentration is N times greater than said first dopant concentration, wherein N is a number in a range of 10 to 100.

12. The memory cell of claim 8, wherein a bottom of said trench is defined by an upper surface of an insulator, and wherein said diffusion region extends within said sidewall below a level defined by said bottom of said trench.

13. The memory cell of claim 12, wherein said diffusion region extends to said main surface of said substrate.

\* \* \* \* \*

UNITED STATES PATENT AND TRADEMARK OFFICE
CERTIFICATE OF CORRECTION

PATENT NO. : 5,753,951
DATED : May 19, 1998
INVENTOR(S) : Geissler

It is certified that error appears in the above-identified patent and that said Letters Patent is hereby corrected as shown below:

| | |
|---|---|
| Column 8, Line 37 | "rate" should read --gate-- |
| Column 9, Line 8 | "share" should read --sharp-- |
| Column 9, Line 20 | "sail" should read --said-- |

Signed and Sealed this

Fifteenth Day of September, 1998

Attest:

BRUCE LEHMAN

Attesting Officer

Commissioner of Patents and Trademarks